US009166642B2

(12) United States Patent
Ochiai

(10) Patent No.: US 9,166,642 B2
(45) Date of Patent: Oct. 20, 2015

(54) SIGNAL RECEIVING DEVICE AND SIGNAL RECEIVING METHOD

(75) Inventor: Toshiyuki Ochiai, Tokyo (JP)

(73) Assignee: LAPIS SEMICONDUCTOR CO., LTD., Yokohama (JP)

(*) Notice: Subject to any disclaimer, the term of this patent is extended or adjusted under 35 U.S.C. 154(b) by 0 days.

(21) Appl. No.: 13/404,343

(22) Filed: Feb. 24, 2012

(65) Prior Publication Data

US 2012/0220250 A1 Aug. 30, 2012

(30) Foreign Application Priority Data

Feb. 28, 2011 (JP) ................................. 2011-042151

(51) Int. Cl.
| | | |
|---|---|---|
| H04B 1/10 | (2006.01) |
| H04B 1/28 | (2006.01) |
| H04B 1/403 | (2015.01) |
| H03J 1/00 | (2006.01) |
| H03J 3/08 | (2006.01) |

(52) U.S. Cl.
CPC .............. *H04B 1/28* (2013.01); *H03J 1/0008* (2013.01); *H03J 3/08* (2013.01); *H04B 1/406* (2013.01); *H03J 2200/10* (2013.01); *H04B 2001/1054* (2013.01)

(58) Field of Classification Search
USPC ............ 455/296, 269, 323; 375/316; 348/723
See application file for complete search history.

(56) References Cited

U.S. PATENT DOCUMENTS

| 4,045,740 | A | * | 8/1977 | Baker ........................... 455/266 |
| 6,106,462 | A | * | 8/2000 | Yaegashi et al. ............... 600/437 |
| 6,968,173 | B2 | * | 11/2005 | Cowley ......................... 455/323 |
| 8,185,071 | B2 | * | 5/2012 | Sano et al. .................. 455/182.2 |
| 2008/0051053 | A1 | * | 2/2008 | Fedan ........................... 455/296 |
| 2008/0311872 | A1 | * | 12/2008 | Ikeda et al. .................... 455/269 |
| 2011/0019783 | A1 | * | 1/2011 | Nakano et al. ................ 375/344 |

FOREIGN PATENT DOCUMENTS

| JP | 05-218894 A | 8/1993 |
| JP | 2002-217768 A | 8/2002 |
| JP | 2006-074435 A | 3/2006 |
| JP | 2007-019847 A | 1/2007 |

(Continued)

OTHER PUBLICATIONS

Japanese Office Action dated on Oct. 28, 2014.

(Continued)

*Primary Examiner* — Junpeng Chen
(74) *Attorney, Agent, or Firm* — Rabin & Berdo, P.C.

(57) ABSTRACT

A signal receiving device and signal receiving method to pass a desired frequency component of an intermediate frequency signal by using an IF filter without increasing a chip area. The signal receiving device comprises: a mixer to mix a received frequency signal with a local oscillation frequency signal to generate an intermediate frequency signal; an IF filter to pass a predetermined frequency component of the intermediate frequency signal; a controlling part which adjusts, according to a frequency band of the intermediate frequency signal, the frequency band of the IF filter, and adjust, according to a center frequency set in the IF filter that fluctuates with the adjustment, a center frequency of the intermediate frequency signal to be inputted in the IF filter; and a demodulating part to demodulate a frequency component of the intermediate frequency signal outputted after passing through the IF filter.

9 Claims, 5 Drawing Sheets

(56) References Cited

FOREIGN PATENT DOCUMENTS

| | | |
|---|---|---|
| JP | 2007-158780 A | 6/2007 |
| JP | 2007-312334 A | 11/2007 |

OTHER PUBLICATIONS

Japanese Office Action mailed on Mar. 31, 2015 with English translation.

* cited by examiner

SIGNAL RECEIVING DEVICE AND SIGNAL RECEIVING METHOD

BACKGROUND OF THE INVENTION

1. Technical Field

The present invention relates to a signal receiving device and signal receiving method to generate and demodulate an IF (Intermediate Frequency) signal by combining a receiving RF (radio frequency) signal and a local oscillating signal.

2. Description of Related Art

Conventionally a signal receiving device is known wherein an IF filtering circuit is equipped to receive an RF signal, and generate an IF signal of an intermediate frequency by mixing the RF signal and a local oscillating signal so as to filter the IF signal. As an IF filtering circuit, generally an active filter is used wherein a resistance and a condenser are set as a filter constant. A resistance value and a capacity value of a condenser are optimized according to a format of an RF signal to receive, an IF frequency, a passing bandwidth, an out-of-band attenuation, or the like.

For example, in order to able to receive a plurality of RF signals having different bandwidths required with a signal receiving device, a method is known wherein the signal receiving device is installed with a plurality of IF filtering circuits so as to select an optimal IF filtering circuit for an RF signal to receive (Patent Literature 1).

Patent Literature 1: Japanese Patent Kokai No. 2002-217768

SUMMARY OF THE INVENTION

However, there was a problem in that a chip area resulted in increasing if a signal receiving device was installed with a plurality of IF filtering circuits similarly to the constitution as disclosed in Patent Document 1 so as to adapt to a plurality of modulation rates or modulation methods.

Moreover, generally, errors occur in a resistance value of resistance or a capacity value of a condenser comprising an IF filter caused by production variations, causing a design target value of a filter passband different from an actual value. There was a problem in that if the filter passband was designed to be large in advance, a design target value of the filter passband could be dealt with even if there was deviation, however, a noise was increased.

Moreover, according to a conventional signal receiving device, there was a problem in that, if a filter passband was changed by adjusting only either a resistance value or a capacity value that was to become a filter constant, a center frequency of an IF filter was changed simultaneously so as to separate from an original IF frequency, thereby an optimal filter passband could not be always set.

The present invention has been made in light of the above-mentioned problems, and an object thereof is to provide a signal receiving device and signal receiving method to pass a desired frequency component of an intermediate frequency signal by using an IF filter without increasing a chip area.

According to the present invention, a signal receiving device comprises: a mixer to mix a received frequency signal with a local oscillation frequency signal generated by a local oscillator so as to generate an intermediate frequency signal; an IF filter in which a center frequency of a passable frequency signal and a frequency band are set so as to pass a predetermined frequency component of the intermediate frequency signal; a controlling part which adjusts, according to a frequency band of the intermediate frequency signal, the frequency band set in the IF filter, and adjusts, according to a center frequency set in the IF filter that fluctuates with the adjustment, a center frequency of the intermediate frequency signal to be inputted in the IF filter; and a demodulating part to demodulate a frequency component of the intermediate frequency signal outputted after it passes through the IF filter.

Moreover, according to the present invention, a signal receiving method comprises: a mixer step to mix a frequency signal received with a local oscillation frequency signal generated by a local oscillator so as to generate an intermediate frequency signal; a filter step to pass a predetermined frequency component of the intermediate frequency signal by an IF filter in which a center frequency of a passable frequency signal and a frequency band are set; a first adjusting step to adjust a frequency band set in the IF filter according to the frequency band of the intermediate frequency signal; a second adjusting step to adjust a center frequency of the intermediate frequency signal in response to a fluctuation of the center frequency set in the IF filter caused by adjustment of a frequency band set in the IF filter; and a demodulating step to demodulate the intermediate frequency signal that has passed through the IF filter.

According to the signal receiving device and signal receiving method of the present invention, it is possible to use an IF filter so as to pass a desired frequency component of an intermediate frequency signal without increasing a chip area.

DETAILED DESCRIPTION OF THE INVENTION

Below, the embodiments of the present invention will be described in detail by referencing the drawings.

First Embodiment

Figure 1:
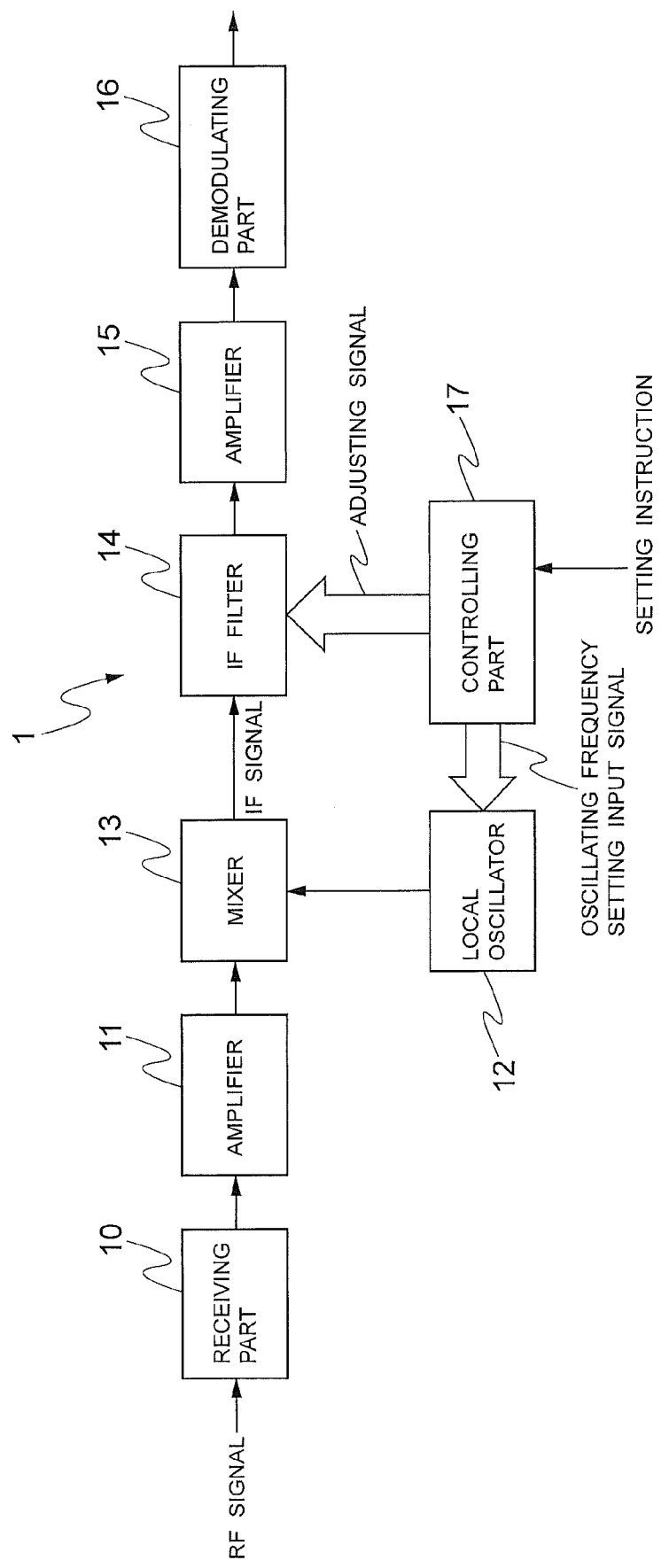
FIG. 1 is a block diagram illustrating a constitution of a signal receiving device that is an embodiment of the present invention.

FIG. 1 is a block diagram illustrating a constitution of a signal receiving device 1 that is an embodiment of the present invention.

The signal receiving device 1 comprises: a mixer 13 to mix a received frequency signal with a local oscillation frequency signal generated by a local oscillator 12 so as to generate an intermediate frequency signal; an IF filter 14 in which a center frequency of a passable frequency signal and a frequency band are set so as to pass a predetermined frequency component of the intermediate frequency signal; a controlling part 17 in which, according to a frequency band of the intermediate frequency signal, the frequency band set in the IF filter 14 is adjusted, and according to a center frequency set in the IF filter 14 that fluctuates with the adjustment, a center frequency of the intermediate frequency signal to be inputted in the IF filter 14 are adjusted; and a demodulating part 16 to demodulate a frequency component of the intermediate frequency signal outputted after it passes through the IF filter 14.

A filter adjusting input signal (hereafter also referred to as a first controlling input signal) is inputted in the IF filter 14. An oscillating frequency setting input signal (hereafter also referred to as a second controlling input signal) is inputted in the local oscillator 12.

A receiving part 10 receives an RF signal wirelessly and supplies it to an amplifier 11.

The amplifier 11 is an amplifier such as a low-noise amplifier (LNA), for example, to amplify the RF signal.

The local oscillator 12 is a local oscillator to generate a local oscillating signal. A frequency of the local oscillating signal is set on the basis of an oscillating frequency setting input signal supplied externally. If the local oscillator 12 is a PLL (Phase Locked Loop) local oscillator, the oscillating frequency setting input signal is a signal to indicate a division ratio. In this case, the local oscillator 12 sets a frequency of the local oscillating signal on the basis of an input reference signal supplied from a crystal oscillator (not illustrated) and the division ratio indicated by the oscillating frequency setting input signal. The PLL local oscillator may have a general constitution including a VCO (Voltage Controlled Oscillator), loop filter, phase comparator, or frequency divider (all of which not illustrated). The frequency divider supplies a division signal generated on the basis of the division ratio indicated by the oscillating frequency setting input signal to the phase comparator.

The mixer 13 is a mixer to mix an RF signal amplified by the amplifier 11 with a local oscillating signal generated by the local oscillator 12 so as to generate an intermediate frequency signal, that is to say an IF signal.

The IF filtering circuit (hereafter referred to as an IF filter) 14 passes only a frequency component of a predetermined band of a frequency component in the IF signal. A filter characteristic of the IF filter 14 is set by a filter adjusting input signal supplied externally. The filter characteristic is a characteristic to decide a passing frequency profile.

An amplifier 15 is an amplifier to amplify an output signal of the IF filter 14 within a predetermined amplitude constraint.

A demodulator 16 demodulates a signal amplified by the amplifier 15 so as to output a base band signal.

The controlling part 17 adjusts a frequency band set in the IF filter 14 according to a frequency bandwidth of an output signal of the IF filter 14. Moreover, the controlling part 17 adjusts a center frequency of an intermediate frequency signal inputted into the IF filter 14 according to a center frequency of an output signal of the IF filter 14 that fluctuates by the adjustment of the frequency bandwidth. More specifically, the controlling part 17 adjusts a center frequency of an intermediate frequency signal by inputting an oscillating frequency setting input signal in the local oscillator 12 so as to fluctuate a frequency of a local oscillating signal.

For example, the controlling part 17 may operate according to a signal from an information processing part (not illustrated) such as a CPU, or a signal or the like manually set by an operator. The controlling part 17 may be divided into two portions wherein one portion adjusts a frequency band set in the IF filter 14, while other portion adjusts a center frequency of an intermediate frequency signal.

The filter adjusting input signal and oscillating frequency setting input signal described above are signals manually input that are obtained by using an electronic component having a manually variable characteristic, for example. These signals may be generated by the controlling circuit. When a controlling input signal is automatically generated, it is possible to obtain an optimal filtering characteristic and a local oscillation frequency to match it by associating contents of these signals to each other on the basis of a rule of thumb, for example. In other words, if a filter adjusting input signal indicating a characteristic thereof is inputted, a local oscillating signal having an optimal frequency corresponding to the filter characteristic is generated.

Figure 2:
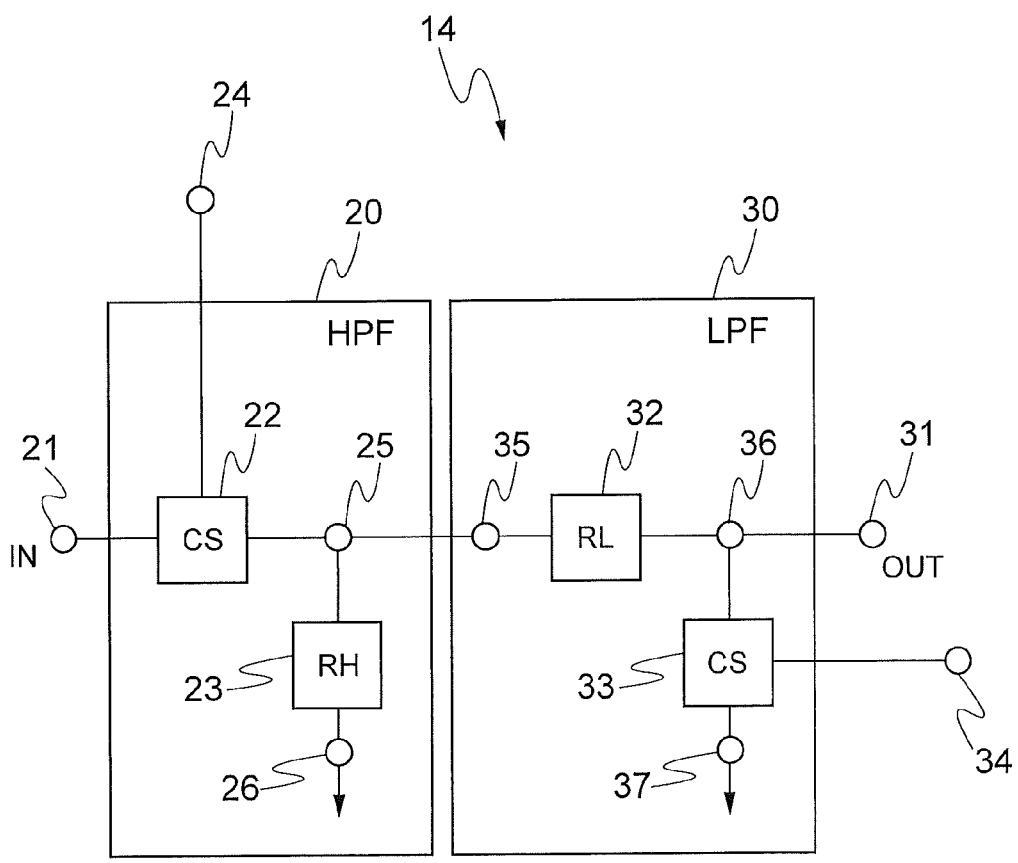
FIG. 2 is a block diagram illustrating a constitution of the IF filter of FIG. 1.

FIG. 2 is a block diagram illustrating a constitution of an IF filter 14. The IF filter 14 comprises a high-pass filter 20 and low-pass filter 30. An IF signal from the mixer 13 is inputted into an inputting terminal 21 of the high-pass filter 20. Output of the high-pass filter 20 is inputted into the low-pass filter 30. Output of the low-pass filter 30 is supplied to the amplifier 15 from the outputting terminal 31.

The high-pass filter 20 is a filter to pass a frequency component having a predetermined frequency band or greater of a frequency component in the IF signal. The high-pass filter 20 includes a condenser block 22 and a resistance 23. The condenser block 22 is connected between the inputting terminal 21 and a connecting terminal 25. The resistance 23 is connected between the connecting terminal 25 and a grounding terminal 26. Grounding potential is supplied to the grounding terminal 26. The IF signal is inputted into the inputting terminal 21 and outputted from the connecting terminal 25. A capacity value of the condenser block 22 can be freely set on the basis of a content of a filter adjusting input signal inputted into a signal inputting part 24.

The low-pass filter 30 is a filter to pass a frequency component having a predetermined frequency band or smaller of a frequency component in the IF signal. The low-pass filter 30 includes a resistance 32 and a condenser block 33. The resistance 32 is connected between a connecting terminal 35 and outputting terminal 36. The condenser block 33 is connected between the outputting terminal 36 and a grounding terminal 37. Grounding potential is supplied to the grounding terminal 37. An IF signal that passes through the high-pass filter 20 is inputted into the inputting terminal 35 and outputted from the connecting terminal 31. A capacity value of the condenser block 33 can be freely set on the basis of a content of a filter adjusting input signal inputted into a signal inputting part 34.

Figure 3:
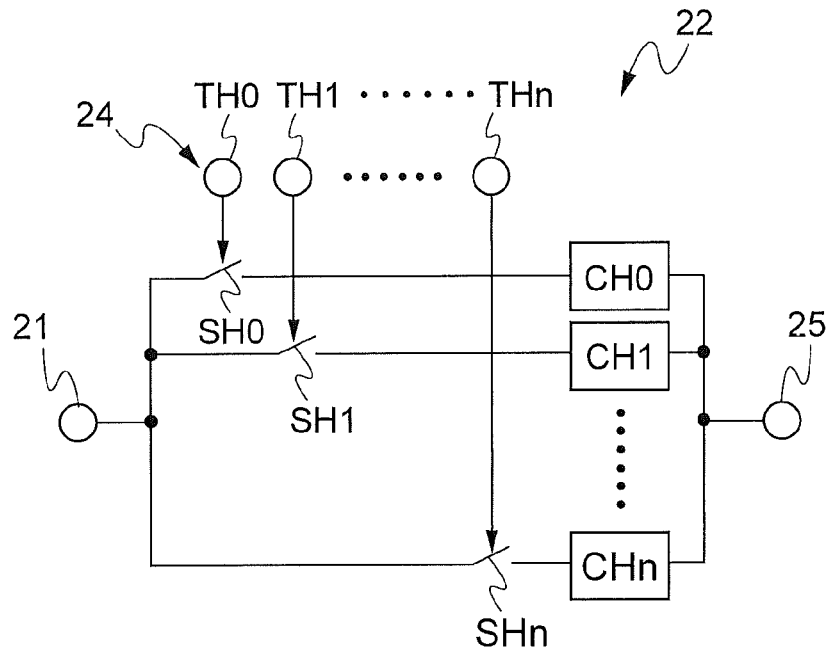
FIG. 3 is a circuit diagram illustrating a constitution of a condenser block included in the high-pass filter of FIG. 2.

FIG. 3 is a circuit diagram illustrating a constitution of a condenser block 22 included in the high-pass filter 20.

A condenser CH0 is disposed between the inputting terminal 21 and connecting terminal 25 via a switch SH0. Similarly, each of condensers CH1-CHn (n is an integer equal to or greater than 2) is disposed between the inputting terminal 21 and connecting terminal 25 via one of corresponding switches SH1-SHn. The constitution causes the condensers CH0-CHn to be connected in parallel to each other.

The signal inputting part 24 comprises signal inputting terminals TH0-THn. A filter adjusting input signal is inputted into the signal inputting terminals TH0-THn. A filter adjusting input signal is a signal indicating a binary bit string, for example. A bit value corresponding to one of a plurality of bit values comprising the bit string is inputted into each of the signal inputting terminals TH0-THn. If a binary bit string is "1 . . . 01" for example, bit value "1" is inputted into the signal inputting terminal TH0, bit value "0" is inputted into the signal inputting terminal TH1, . . . , and bit value "1" is inputted into the signal inputting terminal THn respectively.

The switch SH0 turns on or off according to a bit value inputted into the signal inputting terminal TH0. Similarly, each of the switches SH1-SHn turns on or off according to a bit value inputted into the signal inputting terminals TH1-THn.

Each of the switches SH0-SHn turns off if a bit value is "0" and turns on if a bit value is "1," for example. By turning on or off the switches SH0-SHn, some of the condensers CH0-CHn are selectively connected in parallel between the inputting terminal 21 and connecting terminal 25. Accordingly, it is possible to change a capacity value of the condenser block 22, thereby optimizing the filter characteristic.

Figure 4:
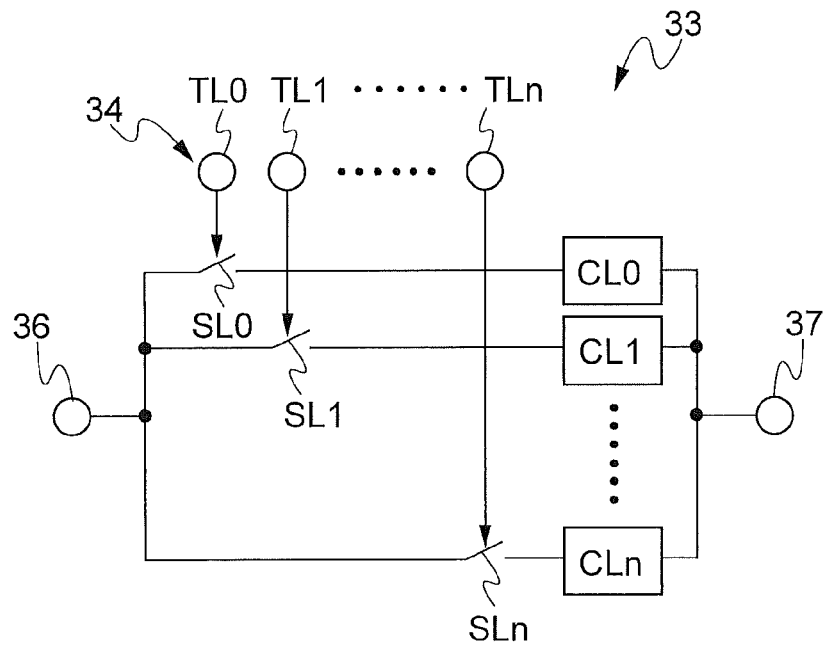
FIG. 4 is a circuit diagram illustrating a constitution of a condenser block included in the low-pass filter of FIG. 2.

FIG. 4 is a circuit diagram illustrating a constitution of a condenser block 33 included in the low-pass filter 30.

A condenser CL0 is disposed between the outputting terminal 36 and grounding terminal 37 via a switch SL0. Similarly, each of condensers CL1-CLn (n is an integer equal to or greater than 2) is disposed between the outputting terminal 36 and grounding terminal 37 via one of corresponding switches SL1-SLn. The constitution causes the condensers CL0-CLn to be connected in parallel to each other.

A signal inputting part 34 comprises signal inputting terminals TL0-TLn. A filter adjusting input signal is inputted into the signal inputting terminals TL0-TLn. A filter adjusting input signal is a signal indicating a binary bit string, for example. A bit value corresponding to one of a plurality of bit values comprising the bit string is inputted into each of the signal inputting terminals TL0-TLn.

The switch SL0 turns on or off according to a bit value inputted into the signal inputting terminal TL0. Similarly, each of the switches SL1-SLn turns on or off according to a bit value inputted into the signal inputting terminals TL1-TLn.

Each of the switches SL0-SLn turns off if a bit value is "0" and turns on if a bit value is "1," for example. By turning on or off the switches SL0-SLn, some of the condensers CL0-CLn are selectively connected in parallel between the outputting terminal 36 and grounding terminal 37. Accordingly, it is possible to change a capacity value of the condenser block 33, thereby optimizing the filter characteristic.

Below, setting processing will be described wherein a signal having a desired frequency profile is outputted from the IF filter 14. The setting processing is performed in a characteristic inspection before product shipment, for example. The setting processing may be performed by a user after products are shipped or can be performed as needed. The setting processing may be performed according to a change of an assumed inputting frequency signal.

The receiving method of a frequency signal according to the present invention comprises: a mixer step to mix a frequency signal received with a local oscillation frequency signal generated by a local oscillator 12 so as to generate an intermediate frequency signal; an filter step to cause an IF filter 14 in which a center frequency of a passable frequency signal and a frequency band are set to pass a predetermined frequency component of the intermediate frequency signal; a first adjusting step to adjust a frequency band set in the IF filter 14 according to the frequency band of the intermediate frequency signal; a second adjusting step to adjust a center frequency of the intermediate frequency signal according to a fluctuation of the center frequency set in the IF filter 14 caused by adjustment of a frequency band set in the IF filter 14; and a demodulating step to demodulate the intermediate frequency signal that passes through the IF filter 14.

As a premise, the signal receiving device 1 operates as follows. First, the receiving part 10 receives an RF signal. The amplifier 11 amplifies the RF signal. The local oscillator 12 generates a local oscillating signal. The mixer 13 mixes the amplified RF signal with the local oscillating signal so as to generate an intermediate frequency signal. The IF filter 14 passes only a frequency component in a predetermined band of a frequency component in the intermediate frequency signal. The amplifier 15 amplifies an output signal of the IF filter 14. The demodulator 16 demodulates a signal amplified by the amplifier 15.

A filter adjusting input signal has been inputted into the IF filter 14 so as to initialize in a desired frequency band. According to a content of the filter adjusting input signal, a capacity value of the condenser block 22 of the high-pass filter 20 and a capacity value of the condenser block 33 of the low-pass filter 30 comprising the IF filter 14 are set. Accordingly, the filter characteristic of the IF filter 14 is initialized.

A cut-off frequency fHPF of the high-pass filter 20 is defined by the following expression (1).

$$f_{HPF} = \frac{1}{2\pi C_S R_H} \quad (1)$$

A cut-off frequency fLPF of the low-pass filter 30 is defined by the following expression (2).

$$f_{LPF} = \frac{1}{2\pi C_S R_L} \quad (2)$$

According to the expressions (1) and (2), the bandwidth BW of the IF filter 14 is expressed by the following expression (3).

$$BW = \frac{1}{2\pi C_S}\left(\frac{1}{R_H} - \frac{1}{R_L}\right) \quad (3)$$

Furthermore, according to the expressions (1) and (2), the center frequency $f_{center}$ is expressed by the following expression (4).

$$f_{center} = \frac{1}{4\pi C_S}\left(\frac{1}{R_H} + \frac{1}{R_L}\right) \quad (4)$$

From the expression (3) and (4), it is understood that the bandwidth BW and center frequency $f_{center}$ change inversely proportional to the capacity value Cs of the condenser blocks 22, 33.

A capacity ratio of each of the condensers CH0-CHn comprising the condenser block 22 is 2n, for example. That is to say, if a capacity value of the condenser CH0 is C0, a capacity value of the condenser CH1 is 2×C0, a capacity value of the condenser CH2 is 4×C0, . . . , a capacity value of the condenser CHn is n×C0. In this case, the capacity value Cs of the condenser block 22 can be gradually changed in a range of C0 to $(2^{n+}-1)×C0$. It is the same with the condenser block 33.

As described above, by inputting a filter adjusting input signal, it is possible to initialize a desired filter characteristic. Furthermore, the center frequency $f_{center}$ can be initialized according to a filter adjusting input signal. A resistance value RH of the resistance 23 and a resistance value RL of the resistance 32 included in the IF filter 14, each capacity value of the condensers CH0-CHn, CL0-CLn included in the condenser block 22, 33 may be any value according to a design condition respectively.

Figure 5:
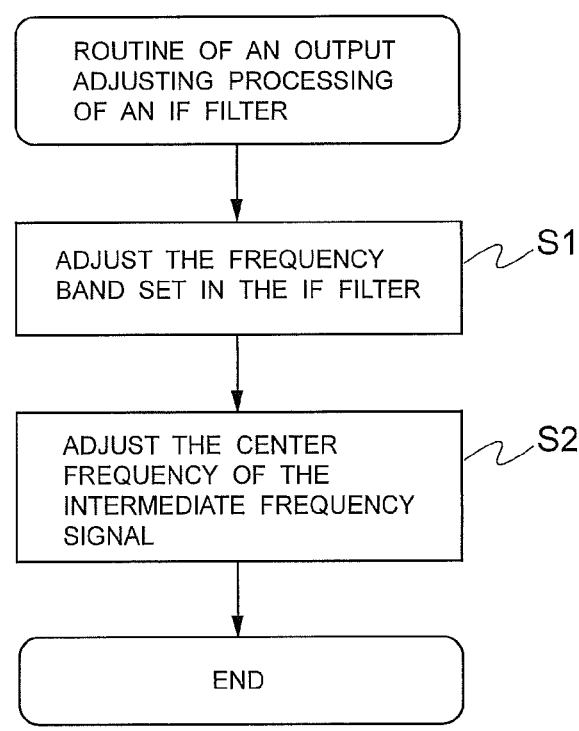
FIG. 5 is a flow chart illustrating a routine of an output adjusting processing of an IF filter.

Thereafter, output of the IF filter 14 is subject to the adjusting processing. FIG. 5 is a flow chart illustrating a routine of an output adjusting processing of an IF filter. Below, the output adjusting processing of an IF filter will be described by referencing FIG. 5.

First, the controlling part 17 adjusts the frequency bandwidth set in the IF filter 14 (Step S1). The controlling part 17 decides an amount to adjust according to the content of a setting signal externally. The setting signal is a signal to set the capacity value Cs of the condenser blocks 22, 33. More specifically, the setting signal is a signal indicating a binary bit string consisting of "0" and "1" for example, inputted into the signal inputting terminals TH0-THn so as to turn on or off each of the switches SH1-SHn of the condenser block 22, for example. Furthermore, a similar setting signal can be supplied into the signal inputting terminals TH0-THn so as to turn on or off the switches SL1-SLn of the condenser block 33. The amount to adjust by the controlling part 17 is decided by changing the capacity value of condenser blocks 22, 33 included in the IF filter 14. By this adjustment, a deviation in the frequency bandwidth caused by production variations of the IF filter 14 can be corrected, and further the frequency bandwidth can be set to the one corresponding to a desired inputting frequency signal. Below, the signal receiving device is described wherein a frequency of a local oscillating signal is set to be lower than a frequency of an RF signal, that is to say, it is set as what is called a lower-side local.

For example, if an actual frequency bandwidth is narrower than a desired frequency bandwidth, a setting signal is sent to the controlling part 17 so as to widen the frequency bandwidth. According to the content of the setting signal, the controlling part 17 inputs a filter adjusting input signal into the IF filter 14 so as to decrease the capacity value Cs of the condenser blocks 22, 33. The filter adjusting input signal decreases the number of parallel connections of the condensers CH0-CHn in the high-pass filter 20 and the number of parallel connections of the condensers CL0-CLn in the low-pass filter 30. A decrease in the capacity value Cs increases the center frequency of the IF filter 14.

Next, the controlling part 17 adjusts a center frequency of an intermediate frequency signal (Step S2). The controlling part 17 decides an amount to adjust according to a content of a setting signal externally. The amount to adjust is decided by a content of an oscillating frequency setting input signal to a local oscillator 12.

For example, a setting signal to widen the frequency bandwidth described above also includes a content to decrease the oscillation frequency. According to the content of the setting signal, the controlling part 17 inputs an oscillating frequency setting input signal to decrease the oscillation frequency to the local oscillator 12, thereby increasing the IF frequency. If the local oscillator 12 is a PLL, the oscillating frequency setting input signal decreases an N value of the division ratio 1/N.

Furthermore, for example, if an actual frequency bandwidth is wider than a desired frequency bandwidth, a setting instruction is sent to the controlling part 17 so as to narrow the frequency bandwidth. According to the content of the setting signal, the controlling part 17 inputs a filter adjusting input signal into the IF filter 14 so as to increase the capacity value Cs of the condenser blocks 22, 33. The filter adjusting input signal increases the number of parallel connections of the condensers CH0-CHn in the high-pass filter 20 and the number of parallel connections of the condensers CL0-CLn in the low-pass filter 30. By increasing the capacity value Cs, the center frequency of the IF filter 14 decreases.

For example, a setting signal to narrow the frequency bandwidth described above also includes a content to increase the oscillation frequency. According to the content of the setting signal, the controlling part 17 inputs an oscillating frequency setting input signal to increase the center frequency of the oscillation frequency to the local oscillator 12, thereby decreasing the IF frequency. If the local oscillator 12 is a PLL, the oscillating frequency setting input signal increases an N value of the division ratio 1/N.

The above example illustrates a case of a lower side local, however, in the case of a signal receiving device 1 wherein a frequency of a local oscillating signal is higher than a frequency of an RF signal, that is to say, if it is set as what is called an upper side local, adjustment of the controlling part 17 is performed as follows. If a setting signal includes a content to widen a frequency bandwidth, a center frequency of the IF filter is increased by adjusting the frequency band. A setting signal in this case also includes a content to increase the oscillation frequency. According to the content of the setting signal, the controlling part 17 inputs an oscillating frequency setting input signal to increase the center frequency of the oscillation frequency to the local oscillator 12. If a setting signal includes a content to narrow a frequency bandwidth, a center frequency of the IF filter is decreased by adjusting the frequency band. A setting signal in this case also includes a content to decrease the oscillation frequency. According to the content of the setting signal, the controlling part 17 inputs an oscillating frequency setting input signal to decrease the center frequency of the oscillation frequency to the local oscillator 12.

By inputting a filter adjusting input signal and oscillating frequency setting input signal having the content, a frequency profile of an output signal of the IF filter 14 can be optimally adjusted. For example, if the contents of a filter adjusting input signal and oscillating frequency setting input signal are fixed for the adjustment before shipment, errors of the filter characteristic have been resolved by the time the signal receiving device 1 is shipped.

As described above, according to the signal receiving device 1 of this embodiment, the frequency band set in the IF filter depending on the content of a setting signal is adjusted, and a center frequency of the IF filter that fluctuates due to the adjustment is also adjusted depending on the content of a setting signal. According to the constitution, it is not necessary to provide a plurality of IF filters as practiced by a conventional technology, which produces an effect in that a chip area is small. Furthermore, by inputting a filter adjusting input signal, the bandwidth BW can be changed, and the center frequency $f_{center}$ that fluctuates by the change can be adjusted by changing the content of an oscillating frequency setting input signal, thereby errors of the IF filter characteristic caused by production variations can be compensated. Furthermore, it becomes possible to realize an optimal IF filter characteristic according to various frequency signals inputted.

Second Embodiment

Figure 6:
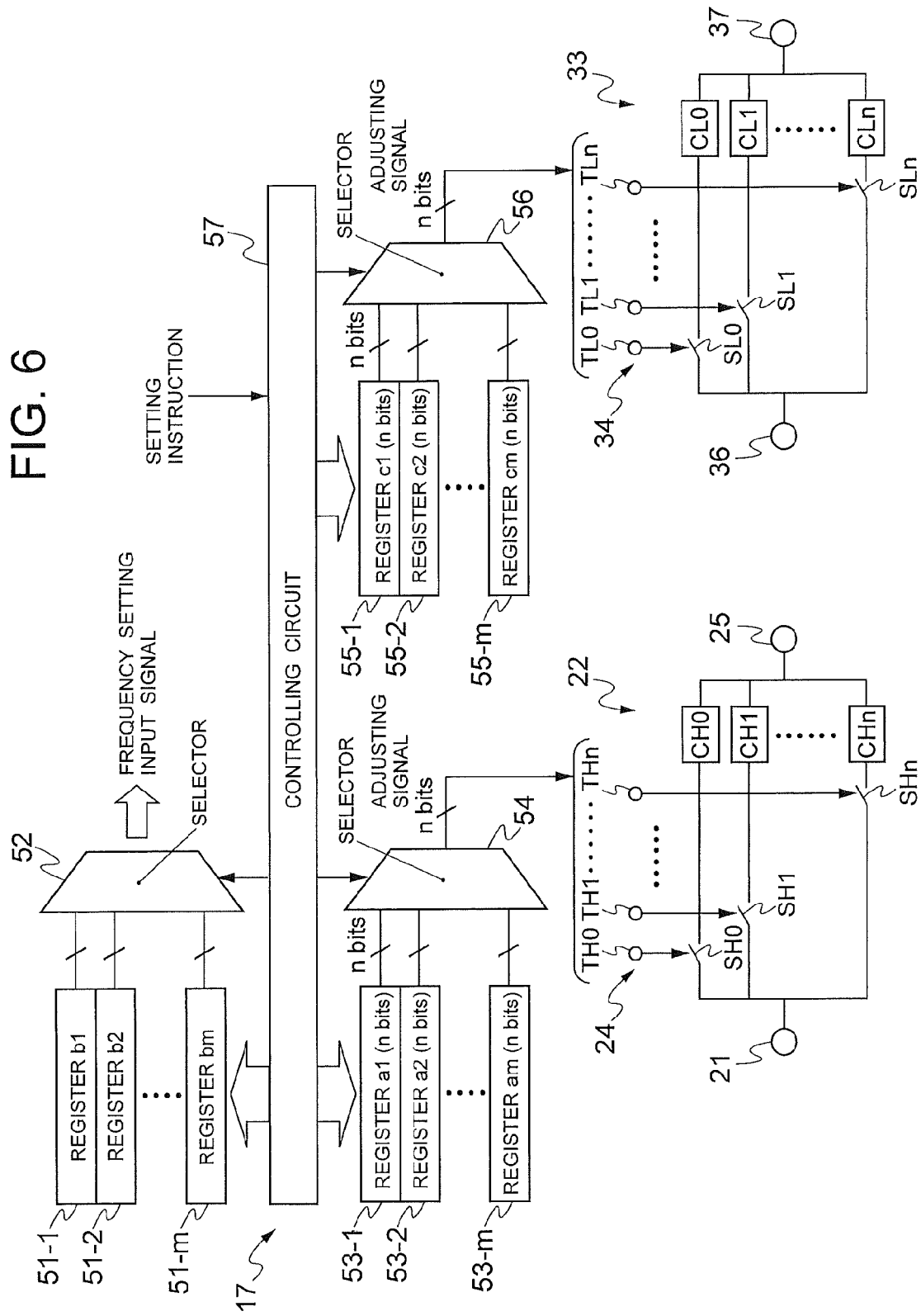
FIG. 6 is a block diagram illustrating a constitution of a controlling circuit and a condenser block.

FIG. 6 is a block diagram illustrating a constitution of a controlling part 17, a condenser block 22, and a condenser block 33. The constitutions of the signal receiving device 1 (FIG. 1) and IF filter 14 (FIG. 2-FIG. 4) are similar to Those of First Embodiment.

The controlling part 17 comprises registers 51-1 to 51-$m$, a selector 52, registers 53-1 to 53-$m$, a selector 54, registers 55-1 to 55-$m$, a selector 56, and a controlling circuit 57.

Data indicating a content of an oscillating frequency setting input signal is memorized in each of the registers 51-1 to 51-$m$. Data different from each other is memorized in each of the registers 51-1 to 51-$m$. The data is supplied from the controlling circuit 57. If the local oscillator 12 is a PLL, the data indicates a division ratio.

The selector 52 selects one of the registers 51-1 to 51-$m$ according to a selection instruction supplied from the controlling circuit 57, and then outputs an oscillating frequency setting input signal that has the data memorized in one of the selected registers. The oscillating frequency setting input signal is supplied to the local oscillator 12 illustrated in FIG. 1.

Data indicating a content of a filter adjusting input signal is memorized in each of the registers 53-1 to 53-$m$. Data different from each other is memorized in each of the registers 53-1 to 53-$m$. The data is n-bit data to be supplied to the inputting terminals TH0-THn of the condenser block 22. The data is supplied from the controlling circuit 57.

The selector 54 selects one of the registers 53-1 to 53-$m$ according to a selection instruction supplied from the controlling circuit 57, and then outputs a filter adjusting input signal that has the data memorized in one of the selected registers. The filter adjusting input signal is supplied to the inputting terminal TH0-THn of the condenser block 22.

Data indicating a content of a filter adjusting input signal is memorized in each of the registers 55-1 to 55-$m$. Data different from each other is memorized in each of the registers 55-1 to 55-$m$. The data is n-bit data to be supplied to the inputting terminals TL0-TLn of the condenser block 33. The data is supplied from the controlling circuit 57.

The selector 56 selects one of the registers 55-1 to 55-$m$ according to a selection instruction supplied from the controlling circuit 57, and then outputs a filter adjusting input signal that has the data memorized in one of the selected registers. The filter adjusting input signal is supplied to the inputting terminals TL0-TLn of the condenser block 33.

The controlling circuit 57 supplies data indicating a content of an oscillating frequency setting input signal to each of the registers 51-1 to 51-$m$, and supplies data indicating a content of a filter adjusting input signal to each of the registers 53-1 to 53-$m$ and registers 55-1 to 55-$m$. These data vary depending on each condition such as a modulation method, modulation rate, or the like. They are data setting an appropriate filter characteristic to match the condition and an IF frequency corresponding to a center frequency that is adapted thereto. Data memorized by the registers 51-1 to 51-$m$ is associated to each other with data memorized by the registers 53-1 to 53-$m$ and registers 55-1 to 55-$m$ on the basis of thumb rules or the like, for example. The controlling circuit 57 can be constituted as a microprocessor chip for LSI's or the like, for example.

For example, filter adjusting data is memorized in the register 51-1, and oscillation frequency setting data is memorized in the registers 53-1, 55-1 so as to generate an IF frequency matching the filter characteristic that the data indicates. The controlling circuit 57 supplies a selection instruction to select the register 51-1 depending on a content of an external setting signal to the selector 52, and supplies a selection instruction to select the registers 53-1, 55-1 to the selectors 54, 56. When the controlling circuit 57 selects a filter characteristic, the constitution allows an appropriate center frequency corresponding thereto to be selected.

As described above, the controlling circuit 55 supplies a selection signal to select one of the registers 51-1 to 51-$m$ and registers 53-1 to 53-$m$ respectively to the selectors 52, 54, and 56 depending on a content of an external setting signal.

Thus, according to the signal receiving device 1 of this embodiment, the filter adjusting data is associated with the oscillation frequency setting data to each other to be memorized in the register, a filter characteristic is selected depending on a condition such as a modulation method, modulation rate, or the like to be actually used, thereby selecting an IF frequency related thereto. When a filter characteristic is selected, the constitution allows an appropriate IF frequency corresponding thereto to be selected.

First and second embodiments are examples to change the filter characteristic by varying a capacity value of the IF filter 14, however, the filter characteristic can be changed by making a resistance value of the IF filter 14 variable. In this case, the IF filter 14 is constituted to include a capacity element and a resistance block that is connected to the capacity element and a resistance value is switchable. The IF filter 14 comprises a high-pass filter and low-pass filter, for example. Each of the high-pass filter and low-pass filter includes a capacity element and a resistance block that is connected thereto and the resistance value is variable. The resistance block is constituted to include a plurality of resistances, for example, and some of the resistances are connected in parallel according to a setting signal supplied from externally or a CPU (not illustrated), for example. The setting signal is a signal to turn on or off each switch connected in series to each of the resistances. By causing the switch to turn on or off so as to change the number of connected resistances in parallel, a resistance value of the resistance block can be changed. By changing a resistance value of the resistance block, the frequency band that is to be set in the IF filter can be adjusted.

This application is based on Japanese patent application No. 2011-042151 which is hereby incorporated by reference.

What is claimed is:
1. A frequency signal receiving device comprising:
a mixer generating an intermediate frequency which has a predetermined center frequency by mixing a received frequency signal with a local oscillation frequency signal generated by a local oscillator, and outputting the intermediate frequency signal;
an IF filter comprising a high-pass filter and a low-pass filter connected in series to each other each of which includes a resistance and condenser block that is connected to the resistance and a capacity thereof is changeable comprising a plurality of condensers connected in parallel to each other via at least one corresponding switch respectively, and receiving said intermediate frequency signal, and causing a frequency signal to pass therethrough, the passed frequency signal existing within a range of a frequency band determined by a center frequency and a size of a frequency bandwidth set in the IF filter;
a controlling part providing the high-pass filter and the low-pass filter with a filter adjusting input signal, which part changes the size of the frequency bandwidth set in the IF filter by changing a capacity value of the condenser block by turning said switch on or off according to frequency components contained in the passed frequency signal, and providing the local oscillator with an oscillating frequency setting input signal, which changes the local oscillation frequency signal so as to match a center frequency of said intermediate frequency signal with the center frequency set in the IF filter that fluctuates with the change of the size of the frequency bandwidth set in the IF filter,
wherein the local oscillator is a Phase Locked LOOP oscillator;
the center frequency and the size of the frequency bandwidth of the IF filter are set by a resistance element having a changeable resistance value or a capacity element having a changeable capacitance value:
the controlling part comprises:
a first storing part in which a plurality of frequency bandwidth setting data pieces each consisting of digital data for setting the size of the frequency bandwidth of the IF filter by changing one of the resistance values of the resistance element and the capacitance value of the capacity element are stored for a plurality of mutually different sizes of the frequency bandwidth, respectively;

a first selecting circuit for selecting one of the frequency bandwidth setting data pieces and outputting the selected data piece to the IF filter;

a second storing part in which a plurality of local oscillation frequency signal setting data pieces each indicating a division ratio for setting the frequency of the local oscillation frequency signal to the local oscillator are stored correspondingly to a plurality of mutually different frequencies of the local oscillation frequency signal; and a second selecting circuit for selecting one of the local oscillation frequency signal setting data pieces and outputting the selected data piece to the oscillator, and the controlling part outputs, in accordance with a setting signal inputted from an outside of the frequency signal receiving device, the filter adjusting input signal to the IF filter by issuing a first selection command for selecting one of the frequency bandwidth setting data pieces to the first selecting circuit, and the oscillation frequency setting input signal to the local oscillator by issuing a second selection command for selecting one of the local oscillation frequency signal setting data pieces to the second selecting circuit, the plurality of local oscillation signal setting data pieces stored in the second storing part are associated to each other with the frequency bandwidth setting data pieces stored in the first storing part so that the center frequency of the intermediate frequency signal matches the center frequency set in the IF filter that fluctuates by setting one of a plurality of mutually different sizes of the frequency bandwidth provided by the frequency bandwidth setting data pieces to the IF filter.

2. The frequency signal receiving device according to claim 1, wherein the plurality of condensers are connected in parallel to each other so that connection to the resistance can be selected; and a capacity value of the condenser block is changed by changing the number of the plurality of condensers to be connected to the resistance.

3. The frequency signal receiving device according to claim 1, wherein a capacity value of the condenser block is changed on the basis of first information of a first memory part in which the first information on the number of the plurality of condensers to be connected to the resistance is memorized in advance, to be selected according to a frequency bandwidth of the intermediate frequency signal.

4. The frequency signal receiving device according to claim 3, wherein the first memory part is equipped with a plurality of first registers equipped with the first information set for each frequency bandwidth of the intermediate frequency signal that is assumed in advance; and a capacity value of the condenser block is changed on the basis of the first information of the first register selected according to a frequency bandwidth of the intermediate frequency inputted.

5. The frequency signal receiving device according to claim 1, wherein a center frequency of the intermediate frequency signal is adjusted based on second information of a second memory part in which memorized in advance is the second information on the center frequency of the intermediate frequency signal to be selected according to a frequency bandwidth of the IF filter that is changed according to the frequency components contained in the passed frequency signal.

6. The frequency signal receiving device according to claim 5, wherein the second memory part is equipped with a plurality of second registers equipped with the second information set for each frequency bandwidth of the intermediate frequency signal that is assumed in advance; and a center frequency of the local oscillation frequency signal is adjusted on the basis of the second information of the second register selected according to a frequency band of the intermediate frequency inputted.

7. The signal receiving device according to claim 1, wherein the condenser block in the high-pass filter comprises:

an inputting terminal to receive the intermediate frequency signal;

a connecting terminal to connect to the low-pass filter; and the plurality of condensers are connected in parallel to each other between the inputting terminal and the connecting terminal via the corresponding switch respectively, and the switch is turned on or off based on a content of a first control input.

8. The signal receiving device according to claim 1, wherein the condenser block in the low-pass filter comprises:

a connecting terminal to connect to the high-pass filter;

an outputting terminal to output the predetermined band signal; and the plurality of condensers are connected in parallel to each other between the connecting terminal and the outputting terminal via the corresponding switch respectively, and the switch is turned on or off on the basis of a content of the first control input.

9. The frequency signal receiving device according to claim 1 wherein the IF filter comprises a capacity element and a resistance block that is connected to the capacity element and a resistance value is changeable; and the size of the frequency bandwidth set in the IF filter is changed by changing a resistance value of the resistance block.

* * * * *